United States Patent
Feldhaus et al.

(10) Patent No.: US 9,558,154 B2
(45) Date of Patent: Jan. 31, 2017

(54) METHOD AND MEASURING DEVICE FOR SUPPRESSING INTERFERENCE SIGNALS

(75) Inventors: Gregor Feldhaus, Munich (DE); Alexander Roth, Dorfen (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 627 days.

(21) Appl. No.: 14/004,435

(22) PCT Filed: May 3, 2012

(86) PCT No.: PCT/EP2012/058063
§ 371 (c)(1),
(2), (4) Date: Sep. 11, 2013

(87) PCT Pub. No.: WO2012/171713
PCT Pub. Date: Dec. 20, 2012

(65) Prior Publication Data
US 2013/0346028 A1  Dec. 26, 2013

(30) Foreign Application Priority Data

Jun. 14, 2011 (DE) .......................... 10 2011 104 139
Jul. 13, 2011 (DE) .......................... 10 2011 079 086

(51) Int. Cl.
*G06F 17/00* (2006.01)
*G01R 23/16* (2006.01)
(Continued)

(52) U.S. Cl.
CPC ............ *G06F 17/00* (2013.01); *G01R 23/16* (2013.01); *G01R 23/18* (2013.01); *G01R 31/2837* (2013.01)

(58) Field of Classification Search
CPC ..... G01R 23/16; G01R 31/2837; G01R 23/18; G06F 17/00
See application file for complete search history.

(56) References Cited

U.S. PATENT DOCUMENTS 4,791,577 A * 12/1988 Winter ................... G01R 23/16
324/76.21
4,918,382 A    4/1990 Bales et al.
(Continued)

FOREIGN PATENT DOCUMENTS

DE        697 21 444 T2    1/2004
DE   10 2004 020 278 A1   11/2005
(Continued)

OTHER PUBLICATIONS

International Search Report issued in corresponding application PCT/EP2012/058063 mailed Sep. 7, 2012.

*Primary Examiner* — John Breene
*Assistant Examiner* — Mohammad Islam
(74) *Attorney, Agent, or Firm* — Carter, DeLuca, Farrell & Schmidt, LLP (57) ABSTRACT

A measuring device for suppressing an interference signal contains a mixer, an analog-digital converter, a scaling device and a substitution device. The mixer is embodied to mix a first signal with a first intermediate frequency and to mix a second signal with a second intermediate frequency. The analog-digital converter is embodied to digitize the first signal mixed with the first intermediate frequency to form a first test signal and to digitize the second signal mixed with the second intermediate frequency to form a second test signal is embodied to displace at least the first test signal and/or the second test signal in its frequency in such a manner that they provide a common mid-frequency. The substitution device is embodied to combine the first test signal and the second test signal with a removal of interference-signal peak-value regions which correspond to the interference signal, to form a combined test signal.

17 Claims, 10 Drawing Sheets

(51) Int. Cl.
    *G01R 23/18*     (2006.01)
    *G01R 31/28*     (2006.01)

(56) References Cited

U.S. PATENT DOCUMENTS

| | | | |
|---|---|---|---|
| 5,629,703 A | 5/1997 | Lewallen | |
| 2002/0094022 A1* | 7/2002 | Bially | H04B 1/7102 375/148 |
| 2002/0154680 A1* | 10/2002 | Hao | H04B 1/707 375/141 |
| 2007/0047669 A1* | 3/2007 | Mak | H03D 3/007 375/316 |
| 2007/0111670 A1* | 5/2007 | Compagne | H03M 3/378 455/67.14 |
| 2007/0202825 A1* | 8/2007 | Park | H04B 17/21 455/226.1 |
| 2007/0229056 A1* | 10/2007 | Gorin | G01R 23/16 324/76.19 |
| 2011/0070852 A1* | 3/2011 | Clement | H04B 15/06 455/131 |
| 2011/0117870 A1* | 5/2011 | Pera | H04B 1/1036 455/307 |
| 2011/0181312 A1* | 7/2011 | Ouslis | G01R 31/3167 324/750.3 |

FOREIGN PATENT DOCUMENTS

| | | |
|---|---|---|
| EP | 0 841 569 A2 | 5/1998 |
| EP | 1 884 876 A2 | 2/2008 |
| WO | 98/59252 A1 | 12/1998 |

\* cited by examiner

METHOD AND MEASURING DEVICE FOR SUPPRESSING INTERFERENCE SIGNALS

The invention relates to a method for suppressing interference signals in test signals, preferably narrow-band interference signals in spectrum analysers, and a corresponding measuring device.

In spectrum analysers, test signals are conventionally converted into an intermediate frequency and then digitised. In this context, analog components of the spectrum analyser can show nonlinear behaviour. In particular, the analog-digital converters which are used to digitise the test signals in the intermediate frequency range often provide nonlinear behaviour. As a result, interference signals can occur, especially narrow-band interference signals in the case of narrow-band excitation. Accordingly, DE 10 2004 020 278 A1 shows a conventional spectrum analyser without such interference-signal suppression.

The invention is based upon the object of providing a method for suppressing an interference signal in a signal and a corresponding measuring device.

The object is achieved according to the invention by the features of the independent claim 1 for the method and by the features of the independent claim 10 for the measuring device. Advantageous further developments form the subject matter of the dependent claims referring back to these claims.

The measuring device according to the invention for suppressing an interference signal contains a mixer, an analog-digital converter and a substitution device. The mixer is embodied to mix a first signal with a first intermediate frequency and to mix a second signal with a second intermediate frequency. The analog-digital converter is embodied to digitise the first signal missed with the first intermediate frequency to form a first test signal and to digitise the second signal mixed with the second intermediate frequency to form a second test signal. The substitution device is embodied to combine the first test signal and the second test signal with a removal of interference-signal, peak-value regions which, correspond to the interference signal, to form a combined test signal. In this manner, a thorough removal of interference-signal components from the test signal is achieved, while the test signal is not falsified. Peak-value regions are advantageously detected, and it is determined whether interference-signal peak-value regions are present.

A scaling device is preferably present. The scaling device is embodied to displace at least the first test signal and/or the second test signal in its frequency in such a manner that they provide a common mid-frequency.

The invention is described by way of example below on the basis of the drawings in which an advantageous exemplary embodiment of the invention is shown. The drawings are as follows.

The functioning of the method according to the invention is initially disclosed on the basis of FIGS. 1-9. Following this, the structure and functioning of the measuring device according to the invention are described on the basis of FIG. 10. The presentation and description of identical elements in similar drawings have not been repeated in some cases.

Figure 1:
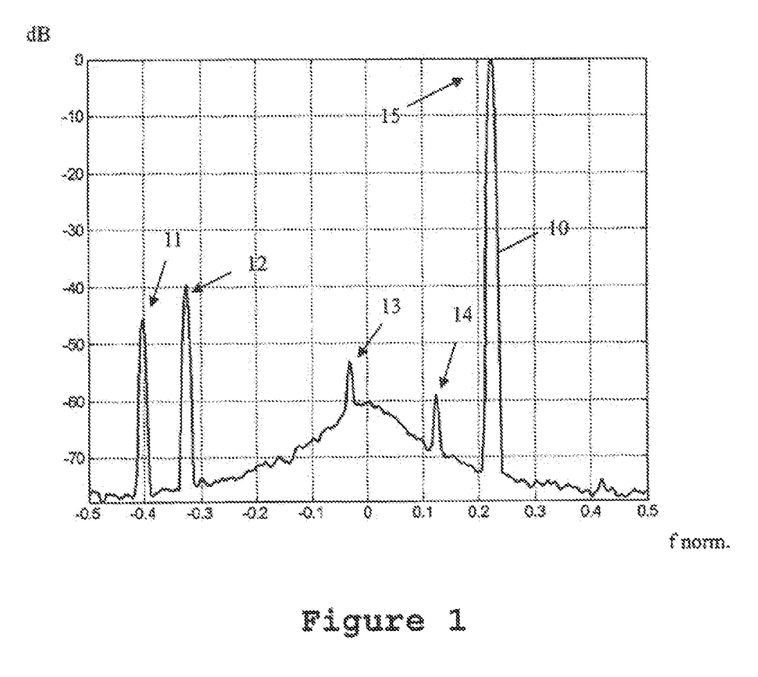
FIG. 1 shows an exemplary test signal.

FIG. 1 shows a first exemplary test signal 10 in the frequency domain. In this context, the frequency is shown on a scaled x-axis. This test signal 10 was generated by mixing a signal with a first intermediate frequency signal and subsequent digitisation. Accordingly, the test signal 10 provides a plurality of peak-value regions 11-15. These peak-value regions 11-15 can either be interference-signal peak-value regions, caused, for example, by nonlinear components of the measuring device, or payload-signal peak-value regions of the connected device under test. It is not possible to differentiate on the basis of this one test signal 10.

Figure 2:
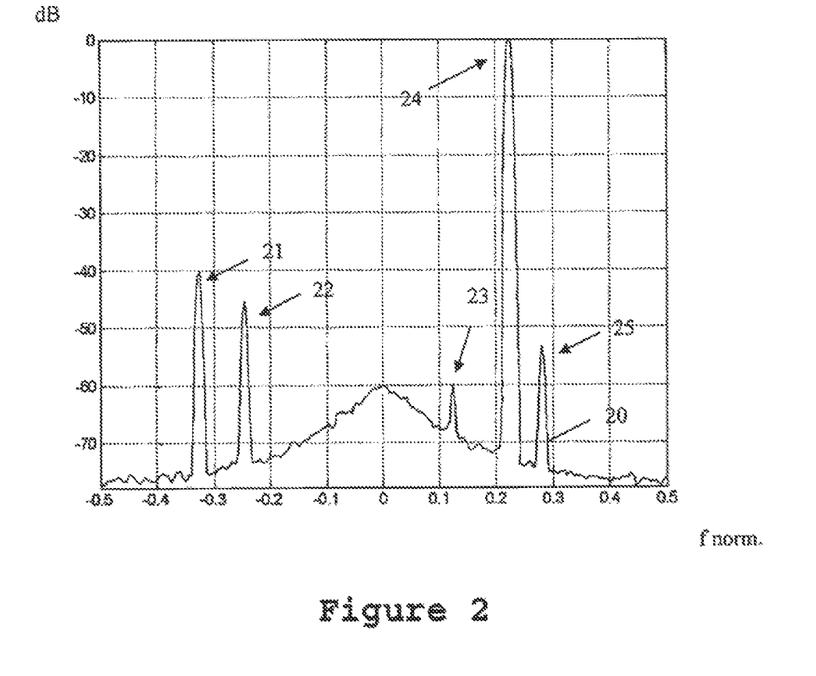
FIG. 2 shows a second exemplary test signal.

FIG. 2 shows a second exemplary test signal 20. The test signal 20 is also illustrated in the frequency domain. Here also, the frequency is scaled. This test signal 20 also originated from mixing an input signal with a second intermediate frequency signal and subsequent sampling. A plurality of peak-value regions 21-25 is also disposed in this second test signal 20. These peak-value regions 21-25 axe attributable either to interference signals or payload signals of the device under test. Here also, a differentiation on the basis of the one test signal 20 is not possible.

The second intermediate-frequency signal provides a different frequency from the first intermediate frequency signal shown in FIG. 1. As a result, interference-signal components, which have originated, for example, from nonlinear components of the measuring device, come to be disposed on a different frequency than is the case in FIG. 1. That is to say, peak-value regions 12, 14, 15 from FIG. 1, which correspond to a peak-value region 21, 23, 24 from FIG. 2, are payload-signal peak-value regions. Peak-value regions 11, 13 and 21, 25 which show no correspondence are interference-signal peak-value regions.

Figure 3:
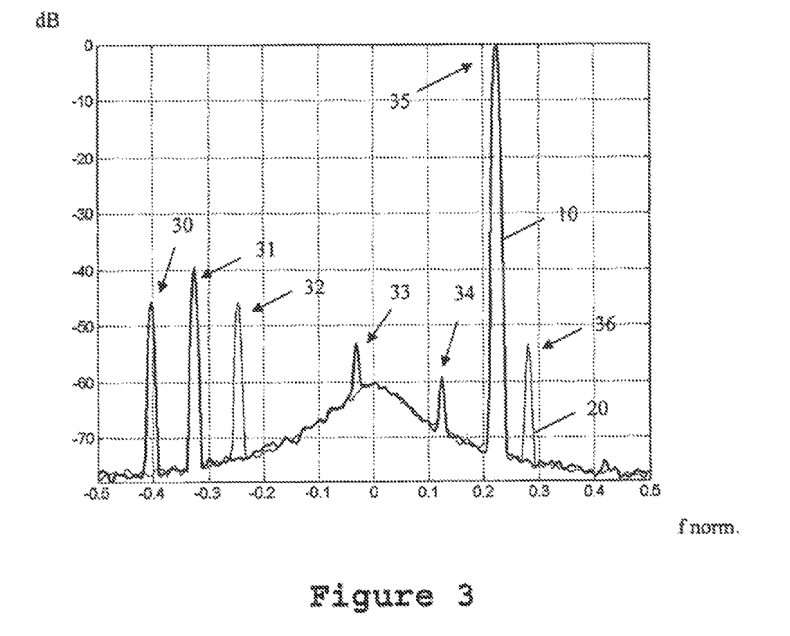
FIG. 3 shows the first exemplary test signal and the second exemplary test signal in a combined presentation.

This is clearly evident from FIG. 3. FIG. 3 shows the first test, signal 10 and the second test signal 20. Peak-values 30-36 of both signals 10-20 are also illustrated. The peak-value region 31 corresponds to the peak-value regions 12 from FIGS. 1 and 21 from FIG. 2. Accordingly, these are payload-signal peak-value regions. The same applies for the peak-value regions 34 and 35, which correspond to the peak-value regions 14, 23 and 15, 24. However, the peak-value regions 30, 32, 33 and 36 are not present in both test signals 10, 20. That is to say, these are interference-signal peak-value regions. These interference signals must be suppressed.

Figure 4:
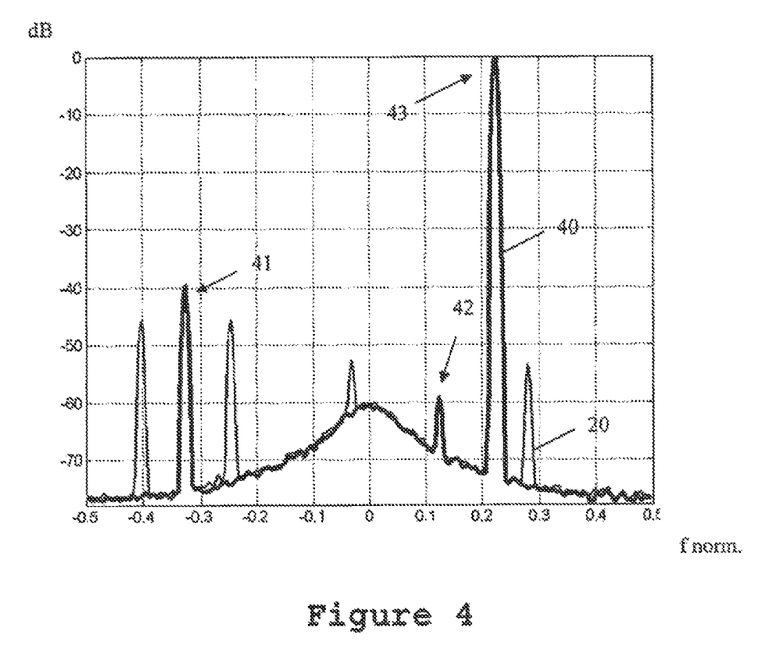
FIG. 4 shows a first exemplary combined test signal.

If the interference signals determined on the basis of FIG. 3 are suppressed, the combined test signal 40, illustrated in bold in FIG. 4, is obtained. It now contains only the peak-value regions 41-43, which are attributable to payload signals of the device under test.

The signals from FIGS. 1-4 provide a very low noise. This is because they are averaged signals. That is to say, the test signal 10 from FIG. 1 and also the test signal 20 from FIG. 2 each correspond to an averaging of, for example, 100 measurements with identical intermediate frequency.

Figure 5:
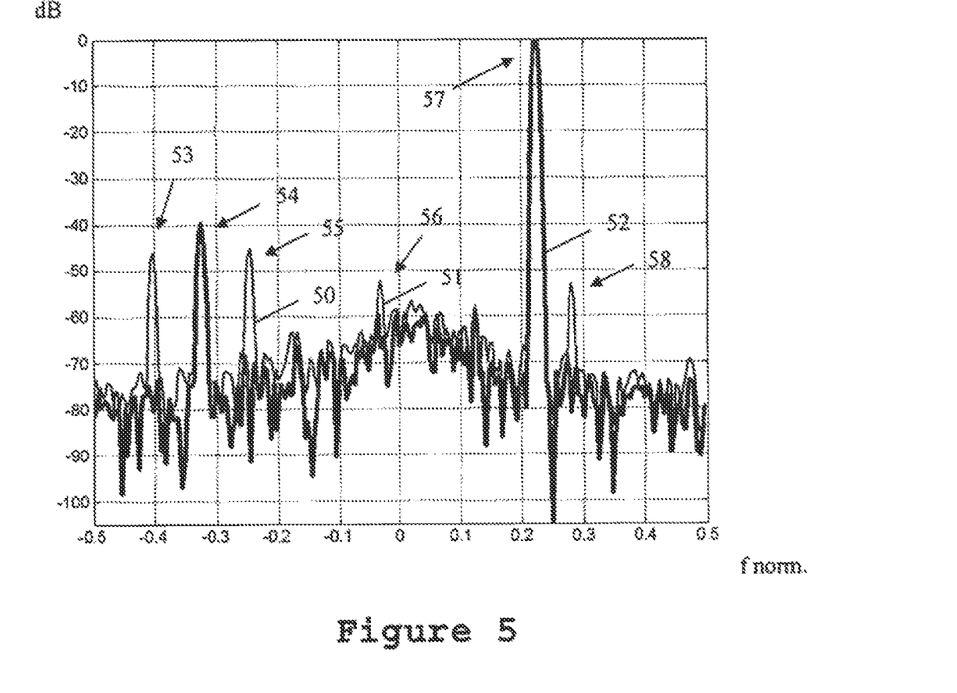
FIG. 5 shows a second exemplary combined test signal.

FIG. 5 shows corresponding signals without averaging. A first test signal 50 originated from mixing an input signal with a first intermediate frequency and subsequent digitisation. A second test signal 51 originated from mixing the input signal with a second intermediate frequency and subsequent digitisation. Both signals 50 and 51 are illustrated here with a scaled frequency. Overall, the peak-value regions 53-58 are obtained. Here also, it is evident that not all of the peak-value regions 53-58 occur in both signals 50, 51. Only the peak-value regions 54 and 57 occur in both signals 50, 51. That is to say, the peak-value regions 54 and 57 are payload-signal peak-value regions. The other peak-value regions 53, 55, 56 and 58 are interference-signal peak-value regions.

FIG. 5 shows a combined test signal 52. It contains only the payload signal peak-value regions 54 and 57. Furthermore, the combined test signal 52 corresponds to the minimum from the signals 50 and 51. However, this procedure generates a systematic error. That is to say, this minimum formation systematically estimates the noise level as excessively low. This is particularly evident in the absence of an averaging, and therefore of a noise suppression.

Figure 6:
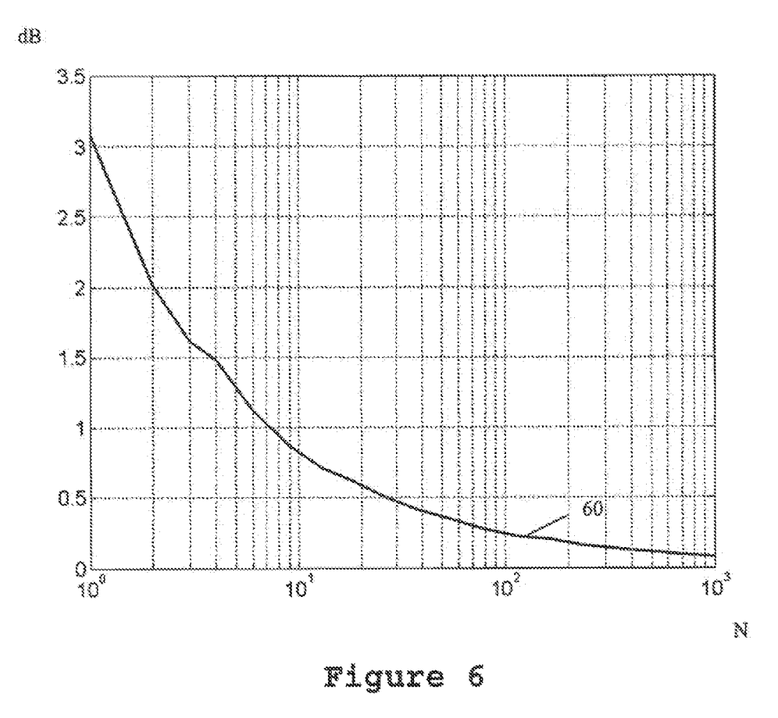
FIG. 6 shows an exemplary view of an anticipated test error.

Accordingly, FIG. 6 shows the magnitude of the systemic error 60 dependent upon the number of measurements N, with which the average was formed in each case. It is evident here that, in the absence of an averaging, an error of more than 3 dB is obtained. In the case of the signals shown in FIG. 1 and FIG. 2 with an averaging of 100 individual measurements, an error of less than 0.5 dB is obtained.

In order to avoid this averaging error, the values of one of the two test signals can be used as an alternative. An amplitude averaging of these two test signals is also possible. However, this leads to a reduction in the variance by comparison with an individual test signal. An averaging of the power of the two test signals is also conceivable.

Figure 7:
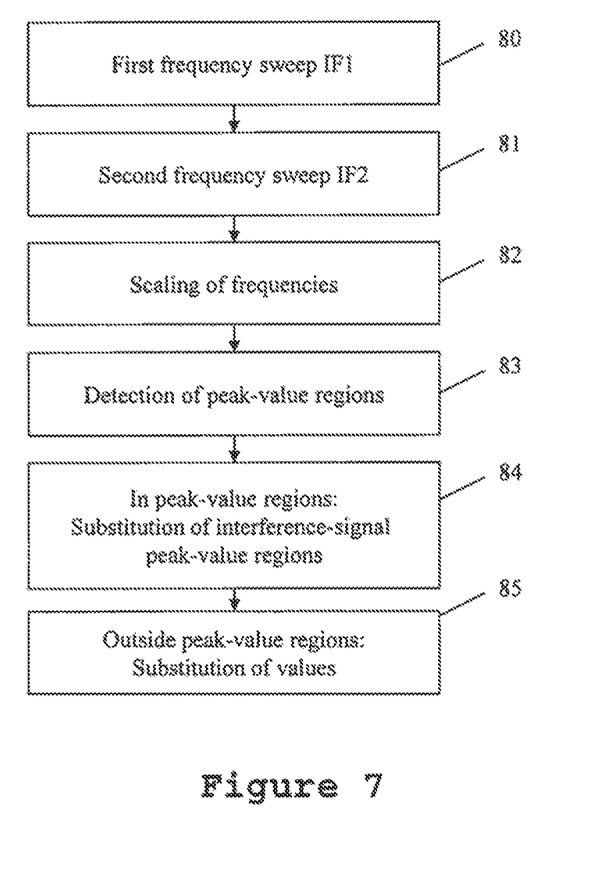
FIG. 7 shows a flow-chart of a first exemplary embodiment of the method according to the invention.

FIG. 7 shows a flow chart of a first exemplary embodiment of the method according to the invention. In a first step 80, a first measurement is implemented. That is to say, the device under test is supplied with a first frequency characteristic. The resulting signal is mixed with an intermediate frequency, and the resulting signal is sampled to form a first test signal.

In a second step 81, the device under test is again supplied with the identical frequency characteristic. The resulting signal is mixed with a second intermediate frequency signal and sampled to form a second test signal. In a third, optional but preferred step 82, the frequencies of the first test signal and/or of the second test signal are scaled, in this context, it is important that the resulting test signals provide an identical mid-frequency.

In the fourth step 83, the peak-value regions of the two test signals are detected. This will be described in greater detail with reference to FIG. 8 and FIG. 9. Following this, in a fifth step 84, interference-signal peak-value regions in the peak-value regions are substituted. That is to say, it is determined whether the peak-value regions determined in the fourth step 83 are interference-signal peak-value regions. This is the case, if the peak-value regions are present only in one of the two test signals. By contrast, if the peak-value regions are present in both test signals, they are not interference-signal peak-value regions, hut payload-signal peak-value regions, which are attributable to pay load signals of the device under test, in the interference-signal peak-value regions, the combined test signal is formed from the test signal which provides no peak-value region in this region.

In a subsequent sixth step 85, outside the determined peak-value regions, the values of the combined test signal are formed, from the values of the two test signals. For example, the mean value of the amplitudes of the two test signals can be used for this purpose. As an alternative, the mean power of the two test signals can also be used. Alternatively, one of the two test signals can also always be used. This last option is the only one which maintains the noise statistic.

Accordingly, outside the peak-value regions, the resulting combined test signal contains a signal which either corresponds to one of the test signals, or has originated from the combination of the two test signals, and within the region of the interference-signal peak-value regions, a signal which corresponds to one of the two test signals. Interference signals, which have originated, for example, from the non-linear behaviour of components of the measuring device, are no longer a part of the combined test signal. The values attributable to the payload signal of the device under test continue to be present in the combined test signal as before.

Figure 8:
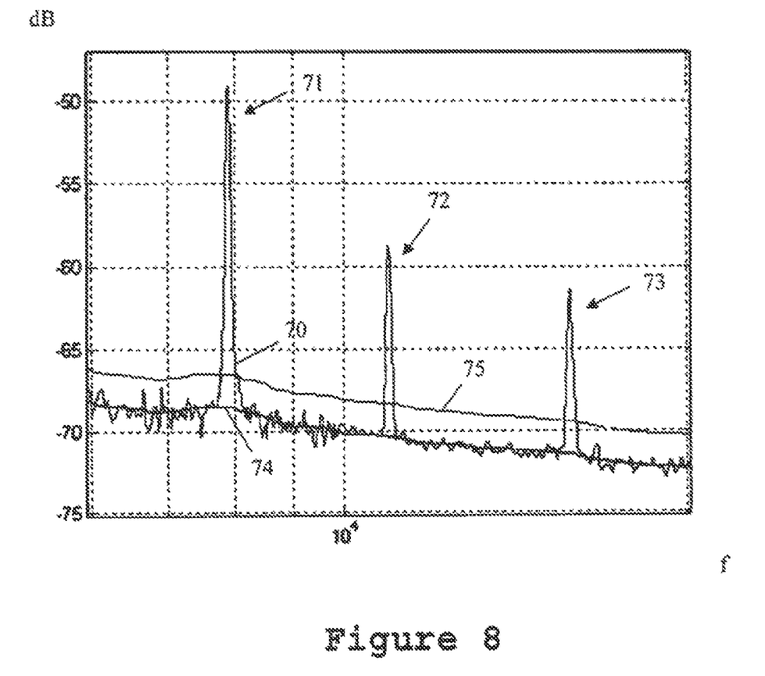
FIG. 8 shows a third exemplary test signal.

FIG. 8 shows a third exemplary test signal 70. This can be the first test signal or the second test signal. It provides the peak-value regions 71-73. In order to detect the peak-value regions 71-73, the test signal 70 is compared with a threshold-value curve 75.

This threshold-value curve 75 is a median curve 74, which is displaced upwards in such a manner that a maximum of 1% of the noise values of the test signal exceed the threshold-value curve 75. Alternatively, a different percentage, for example, 2% or 5%, can also be used.

Figure 9:
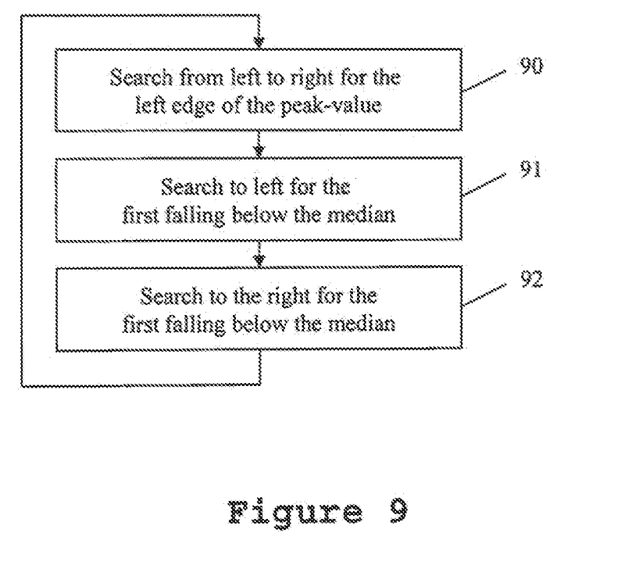
FIG. 9 shows a flow chart of a second exemplary embodiment of the method according to the invention.

With a very simple procedure, all signal components of the test signal 70 which exceed the threshold-value curve 75 can be regarded as a peak-value region 71-73. However, this would lead to systematic errors. Accordingly, a value at the level of the threshold-value curve 75 would be present directly before and after the peak-value regions. This would significantly influence the signal statistics. To avoid this error, the method illustrated in FIG. 9 is used for the detection of the peak-value regions 71-73.

Accordingly, in a first step 90 the left-hand edge of the peak-value region is searched for from left to right. Such an edge is identified when the test value 70 exceeds the threshold-value curve 75. Starting from this determined point, the first falling below a median curve 74 of the test signal 70 is searched for from right to left.

In this context, the median curve 74 corresponds to a filtering of the spectrum with a median filter, that is to say, the peak-values are rejected. This point is regarded as the beginning of the peak-value region. Starting from this point, a search is carried out from left to right from a first falling below the median curve 74 by the test signal 70. This point is identified as the end of the peak-value region.

Figure 10:
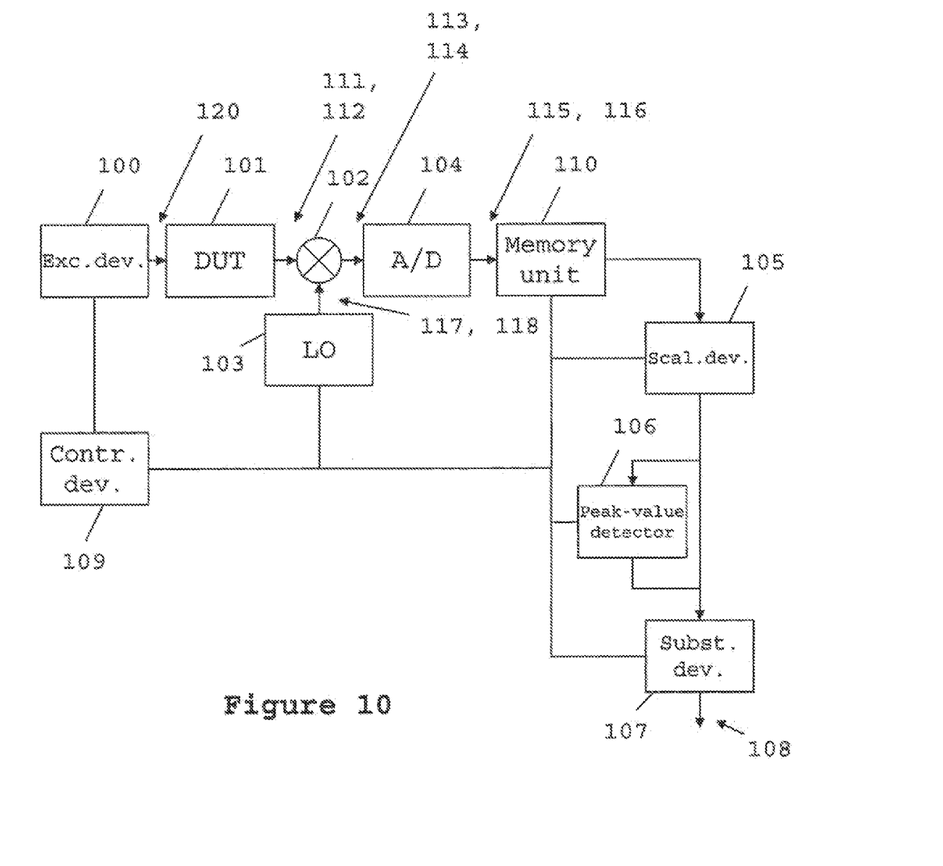
FIG. 10 shows a block-circuit diagram of an exemplary embodiment of the measuring device according to the invention.

FIG. 10 shows an exemplary embodiment of the measuring device according to the invention. An excitation device 100 is connected to a control device 109. The excitation device 100 is further connected to a signal input of a device under test 101. A signal output of the device under test 101 is connected to a mixer 102. The mixer 102 is further connected to a local oscillator 103, which is again connected to the control device 109. A signal output of the mixer 102 is connected to an analog-digital converter 104. The analog-digital converter 104 is connected to a memory unit no, which is in turn connected to a preferred scaling device 105. The memory unit 110 and the scaling device 103 are also connected to the control device 109. The scaling device 105 is further connected to a peak-value detector 105 and a substitution device 107. The peak-value detector 106 is also connected to the substitution device 107. Both the peak-value detector 106 and also the substitution device 107 are also connected to the control device 109.

The control device 109 controls the excitation device 100 in such a manner that the latter generates an excitation signal 120 which it supplies to the device under test 101. This excitation signal 120 is a frequency sweep. Different excitation signals are also conceivable. The device under test 101 processes the excitation signal 120 and outputs a first signal 111. This is transmitted to the mixer 102. The mixer 102 mixes the first signal with a first intermediate frequency 117, which is generated by the local oscillator 103. The generation of this first intermediate frequency 117 is also controlled by the control device 109. The resulting signal 113 is sampled by the analog digital converter 104 and digitised, and, in this manner, processed to form a first test signal 115, which is present in digital form. This resulting first test signal 115 is supplied to the memory unit 110 and stored by the latter.

In a second run, under the control of the control device 109, the excitation device 100 excites the device under test 101 with an identical excitation signal 120. The device under test 101 processes the excitation signal 120 and generates a second signal 112 largely identical to the first signal 111. The first signal 111 and the second signal 112 differ only in their interference components. That is to say, the noise component differs. This second signal 112 is mixed by the mixer 103 with a second intermediate frequency 118, which is generated by the local oscillator 103 under the control of the control device 109. The resulting signal 114 is supplied to the analog-digital converter 104, which digitises it to form a second test signal 116. This second test signal 116 is supplied to the memory unit 110 and stored by the latter.

The first intermediate frequency 117 and the second intermediate frequency 118 thus differ from one another. The first test signal 115 and the second test signal 116 accordingly provide a frequency offset. Payload signal components, that is, components generated by the device under test 101 in the two test signals 115, 116, are present displaced by this frequency offset, interference signals, which have been generated, for example, by nonlinear behaviour of the analog-digital converter 104, do not provide this frequency offset. They can provide an arbitrary, different frequency offset.

As soon as both runs have been completed, the control device 109 controls the memory unit 110 in such a manner that it reroutes the first test signal 115 and the second test signal 116 to the scaling device 105. The first test signal 115 and the second test signal 116 are scaled by the scaling device 105 to a common mid-frequency. That is to say, in the frequency domain, the frequency offset of the first test signal 115 and of the second test signal 116 is cancelled by displacing at least one of the two signals. The resulting signals now provide a common mid-frequency.

Payload-signal components are now disposed one above the other. By contrast, interference-signal components are disposed only in one of the two signals. The two resulting test signals are supplied, under the control of the control device 109, to the peak-value detector ICS. This detects peak-value regions in each of the signals. The precise function of the peak-value detector 106 is shown in FIG. 8 and FIG. 9.

Under the control of the control device 109, the scaled test signals are transmitted further toy the scaling device 105 to the substitution device 107. Moreover, the peak-value detector 106 makes the detected peak-value regions available to the substitution device 107. Under the control of the control device 109, the substitution device 107 now generates a common output signal 108. In regions of the two scaled test signals in which a peak-value region has been detected in one of the signals but not in the other, the signal without peak-value region is adopted into the common output signal. The peak-value region detected in the one signal is merely an interference-signal peak-value region.

By contrast, if a peak-value region has been detected in both signals, this is a payload-signal peak-value region. In this case, and also in all regions in which peak-value regions have not been detected in both signals, tooth signals are averaged and the resulting signal is adopted into the common output signal. As an alternative to this averaging, a power-related averaging can also be implemented. As a further alternative, always the first test signal or always the second test signal can also be used.

The invention is not restricted to the exemplary embodiment presented. As already mentioned, different interference signals can be compensated. A restriction to interference signals, which are based on the nonlinear behaviour of measuring-device components, especially of the analog-digital converter, is not provided. All of the features described above or illustrated in the drawings can be combined with one another as required within the framework of the invention.

The invention claimed is:

1. A method for suppressing an interference signal, comprising:
   mixing a first signal with a first intermediate frequency, and digitising the resulting signal to form a first test signal;
   mixing a second signal, a noise component of which differs from a noise component of the first signal, with a second intermediate frequency, and digitising the resulting signal to form a second test signal;
   displacing at least the first test signal and/or the second test signal in its frequency in such a manner that they provide a common mid-frequency;
   combining the first test signal and the second test signal with a removal of interference-signal peak-value regions to form a combined test signal;
   determining peak-value regions of the first test signal and of the second test signal; and
   comparing the first test signal and the second test signal with a threshold-value curve in order to determine the peak-value regions.

2. The method according to claim 1, further comprising:
   detecting interference-signal peak-value regions;
   combining the first test signal and the second test signal to form a combined test signal outside the interference-signal peak-value regions; and
   forming the combined test signal from a test signal, which provides no interference-signal peak-value region, in the interference-signal peak-value regions.

3. The method according to claim 2, wherein for the combination of the first test signal and the second test signal to form the combined test signal, a minimum or a mean level or a mean power of the test signal is used.

4. The method according to claim 2, wherein an interference-signal peak-value region is detected if a peak-value region is present either in the first test signal or the second test signal.

5. The method according to claim 1, further comprising selecting threshold-value curves in such a manner that a maximum of 5% of values of the respective test signal exceed the threshold-value curve.

6. The method according to claim 1, further comprising determining threshold value curves from median curves of the first test signal and the second test signal.

7. The method according to claim 1, wherein determining peak-value regions comprises:

searching for a first exceeding of the threshold-value curve;

searching from the first exceeding of the threshold-value curve for a last falling below a median curve; and/or searching from the first exceeding of the threshold-value curve for a first falling below the median curve.

8. The method according to claim 1, wherein the first signal and the second signal are generated respectively by supplying a device under test with an identical excitation signal, which contains a frequency characteristic.

9. A measuring device for suppressing an interference signal, comprising:

a mixer;

an analog-digital converter; and a substitution device;

a scaling device; and a peak-value detector, wherein the mixer mixes a first signal with a first intermediate frequency and a second signal, a noise component of which differs from a noise component of the first signal, with a second intermediate frequency, wherein the analog-digital converter digitises the first signal mixed with the first intermediate frequency to form a first test signal and digitises the second signal mixed with the second intermediate frequency to form a second test signal, and wherein the substitution device combines the first test signal and the second test signal with a removal of interference-signal peak-value regions to form a combined test signal, wherein the scaling device displaces at least the first test signal and/or the second test signal in its frequency in such a manner that they provide a common mid-frequency, wherein the peak-value detector determines peak-value regions of the first test signal and the second test signal, and wherein, for the determination of the peak-value regions, the peak-value detector compares the first test signal and the second test signal respectively with a threshold-value curve.

10. The measuring device according to claim 9, further comprising a peak-value detector configured to detect peak-value regions of the first and second test signals, wherein the substitution device detects interference-signal peak-value regions, in order to combine the first test signal and the second test signal outside the interference-signal peak-value regions to form the combined test signal, and/or within the interference-signal peak-value regions to form the combined test signal from the first test signal and the second test signal which provides no interference-signal peak-value region.

11. The measuring device according to claim 9, wherein the substitution device combines the first test signal and the second test signal to form the combined test signal by using a minimum, or a mean level or a median power of the first test signal and the second test signal.

12. The measuring device according to claim 9, wherein the substitution device detects an interference-signal peak-value region, if a peak-value region is present either in the first test signal or the second test signal.

13. The measuring device according to claim 9, wherein the peak-value detector selects threshold-value curves in such a manner that a maximum of 5% of values of the respective test signal exceed the threshold-value curve.

14. The measuring device according to claim 9, wherein the peak-value detector determines the threshold-value curve from median curves of the first test signal and the second test signal.

15. The measuring device according to claim 9, wherein, for the determination of the peak-value regions, the peak-value detector implements a search for a first exceeding of the threshold-value curve, a search from the first exceeding of the threshold-value curve for a last falling below a median curve, and/or a search from the first exceeding of the threshold-value curve for the first falling below the median curve.

16. The measuring device according to claim 9, further comprising an excitation device for supplying the measuring device under test with an excitation signal, wherein the excitation signal has a frequency characteristic, and wherein, in the determination of the first signal and the second signal, the excitation signal is identical.

17. The method according to claim 1, further comprising selecting the threshold-value curves in such a manner that a maximum of 1% of values of the respective test signal exceed the threshold-value curve.

* * * * *